(12) United States Patent
Bailey et al.

(10) Patent No.: US 9,788,451 B2
(45) Date of Patent: Oct. 10, 2017

(54) BLOCK CHASSIS SLED HAVING ONE-THIRD WIDTH COMPUTING AND STORAGE NODES FOR INCREASED PROCESSING AND STORAGE CONFIGURATION FLEXIBILITY WITHIN A MODULAR, SCALABLE AND/OR EXPANDABLE RACK-BASED INFORMATION HANDLING SYSTEM

(71) Applicant: DELL, INC., Round Rock, TX (US)

(72) Inventors: Edmond Bailey, Cedar Park, TX (US); Jimmy Pike, Georgetown, TX (US); Joseph Vivio, Santa Rosa, CA (US)

(73) Assignee: Dell Products, L.P., Round Rock, TX (US)

( * ) Notice: Subject to any disclaimer, the term of this patent is extended or adjusted under 35 U.S.C. 154(b) by 83 days.

(21) Appl. No.: 14/139,812

(22) Filed: Dec. 23, 2013

(65) Prior Publication Data

US 2016/0353599 A1    Dec. 1, 2016

(51) Int. Cl.
*G06F 1/18* (2006.01)
*H05K 7/00* (2006.01)
*H05K 7/14* (2006.01)

(52) U.S. Cl.
CPC .................. *H05K 7/1485* (2013.01)

(58) Field of Classification Search
CPC ........................................................ H05K 7/00
USPC ..................................................... 361/679.01
See application file for complete search history.

(56) References Cited

U.S. PATENT DOCUMENTS

2010/0172083 A1* 7/2010 Randall ................ G11B 33/126
                                                    361/679.31

* cited by examiner

*Primary Examiner* — Jerry Wu
(74) *Attorney, Agent, or Firm* — Isidore PLLC

(57) ABSTRACT

Modular, expandable rack assembly physically supports components of information handling systems. Base structure of interconnected panels form volumetric space having front section and rear section, with opposing side panels forming front access space and rear access space, respectively, having width that supports insertion of standard full-width IT gear. Guides are located within interior surfaces of opposing side panels at the front section to rear section. Block chassis has frame that provides block height to enable insertion of at least one layer of up to N side-by-side fully functional IT gears within block chassis, which in turn is physically inserted into front section of base structure and held in place by opposing guides of opposing side panels. When N is 3, three side-by-side one-third width IT sleds, each containing IT gear, are inserted in respective one-third width IT bays of block chassis.

8 Claims, 11 Drawing Sheets

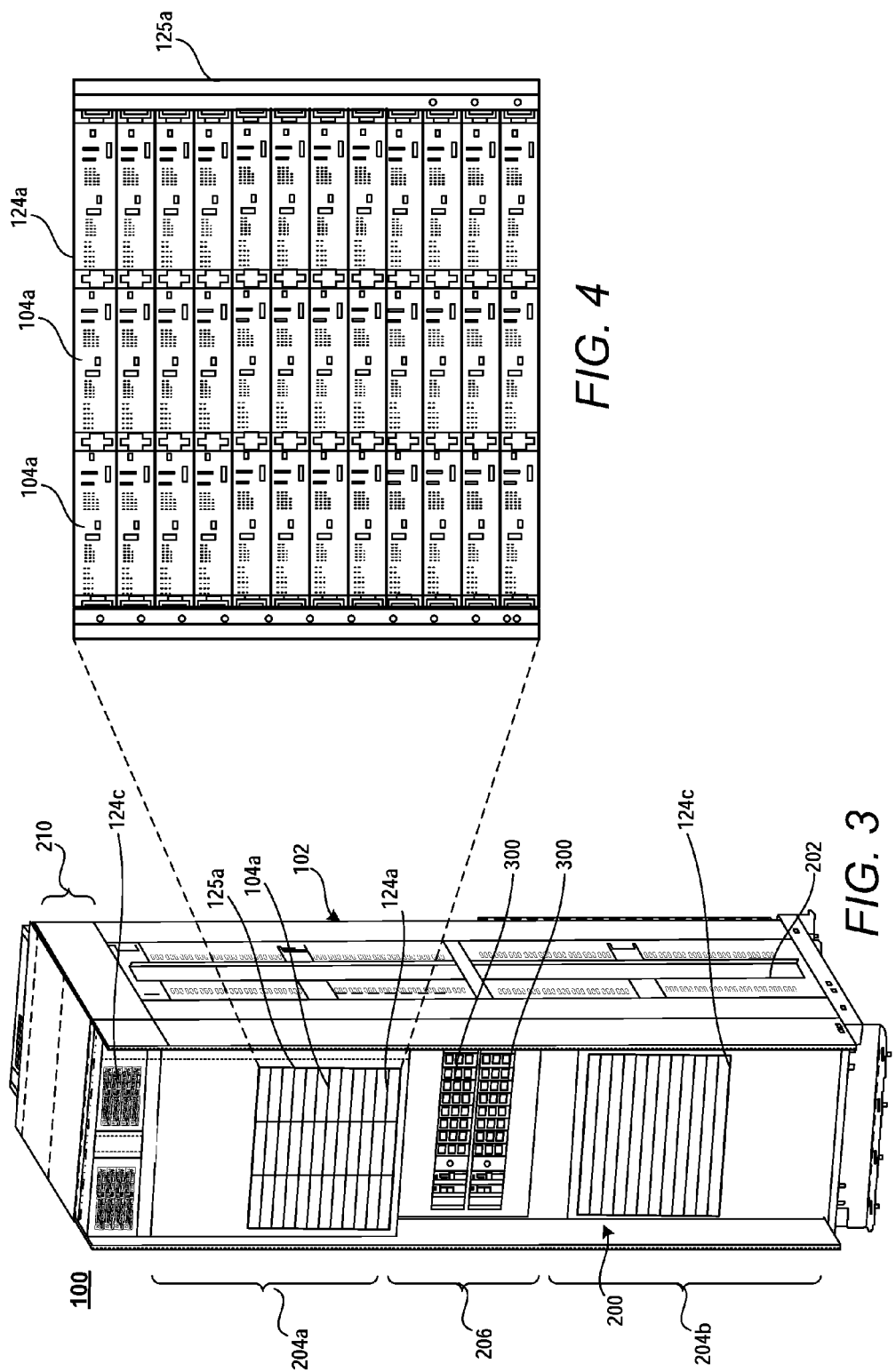

BLOCK CHASSIS SLED HAVING ONE-THIRD WIDTH COMPUTING AND STORAGE NODES FOR INCREASED PROCESSING AND STORAGE CONFIGURATION FLEXIBILITY WITHIN A MODULAR, SCALABLE AND/OR EXPANDABLE RACK-BASED INFORMATION HANDLING SYSTEM

BACKGROUND

1. Technical Field

The present disclosure generally relates to an information handling system and in particular to a block chassis and sled configuration for a modular, scalable, and expandable rack-based information handling system and design.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Standardization of dimensions of rack servers fosters design and manufacturing economies for IT components. Rack assemblies, such as those based on a 19 inch frame size, have a lateral dimension defined to handle full-width server sleds containing IT gear for computing and/or storage. Installing or servicing each rack server generally affects all of the IT gear in the full-width server sled. Storage IT gear contained in the IT sled is constrained to be one of cold serviceable or hot serviceable. When cold serviceable storage IT gear is selected for the full-width server rack, any computing IT gear contained in the full-width IT sled necessarily does not operate when the full-width server rack is being cold serviced.

BRIEF SUMMARY

Disclosed are a rack-based information handling system (IHS) and a method for providing one-third width IT sleds within a modular, scalable and expandable, rack-based IHS. The racked-based IHS includes a modular, expandable rack assembly with opposing side panels spaced to receive block chasses capable of housing a plurality of information technology (IT) components from an open front side of the rack assembly. A block chassis is inserted into the rack assembly having one or more rows for insertion of IT sleds. Three side-by-side one-third width IT sleds have side panels connected by a base panel and are inserted in at least one of the one or more rows and each containing IT gear. Configuration and design aspects as well as functional use of the one-third width IT sleds are also disclosed.

According to at least one aspect of the present disclosure, a modular, expandable rack assembly for physically supporting components of one or more information handling systems (IHSes) includes a base structure having a plurality of interconnected panels forming a volumetric space having a front section and a rear section, with opposing side walls forming a front access space and a rear access space, respectively, having a width that supports insertion of a standard full-width IT gear. A plurality of guides are located within interior surfaces of the opposing side walls at the front section, the plurality of guides running from the front section to the rear section. A block chassis is physically inserted into the front section of the base structure and held in place by at least two opposing guides of the opposing side walls. The block chassis has a frame that provides a block height, which enables insertion of at least one layer of up to N side-by-side fully functional IT gears within the block chassis, where N is equal to three and the chassis supports insertion of three side-by-side one-third width IT sleds.

According to at least one aspect of the present disclosure, a method is provided for assembling a rack-based IHS. The method includes assembling a modular, expandable rack assembly having side panels spaced to receive a block chassis capable of housing a plurality of IT gear from an open front side of the rack assembly. The method includes assembling at least one block chassis having a frame that provides a block height, which enables insertion of at least one layer of up to N side-by-side fully functional IT gears within the block chassis, wherein N is an integer from among 1, 2, and 3. When N=3, the method includes providing one or more layers of three (3) side-by-side fully functional IT gears inserted in the at least one block chassis, wherein the three side-by-side fully functional IT gears comprise three one-third widths IT gear that are one third a size of a standard width IT gear. Method further includes physically inserting the block chassis into the rack assembly. The resulting rack-based IHS can concurrently support full width, half width and one-third width sleds within a same block or across multiple blocks.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements.

Embodiments incorporating teachings of the present disclosure are shown and described with respect to the figures presented herein, in which:

FIG. 3 illustrates a front isometric view of the example rack of FIG. 2 after insertion of functional components for the rack to operate as an IHS, according to one embodiment;

FIG. 4 illustrates a front view of a block having one-third width IT nodes, according to one embodiment;

DETAILED DESCRIPTION

Figure 1:
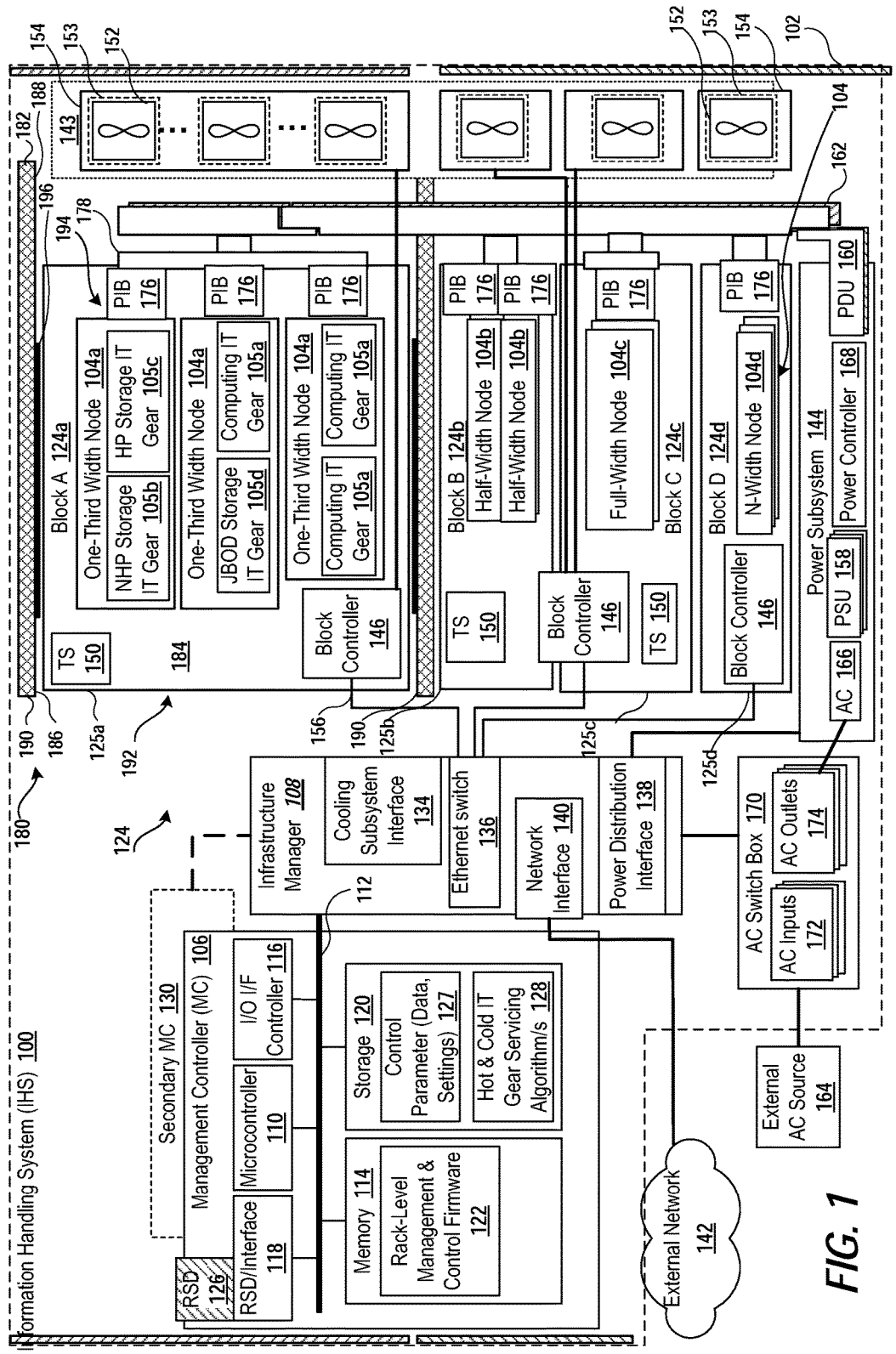
FIG. 1 illustrates a block diagram of an example information handling system (IHS) within which various aspects of the disclosure can be implemented, according to one or more embodiments.

The present innovation provide fractional width information technology (IT) gear that enable side-by-side IT gear placement and design of corresponding fractional width it gear sleds that enable side-by-side insertion into a row of a block chassis of a standard width rack. The present innovation further provides the fractional width IT sleds with direct power coupling and block-level control when inserted into a modular, scalable and expandable information handling system (IHS) rack. For example, the IT sled may be full width, half width or one-third width. In one or more embodiments, the IT gear may include computer nodes, servers, and/or nonvolatile storage that are individually installed into IT sleds that are one-third of a standard width of a rack server. Scaling a rack infrastructure to support side-by-side placement of various types of IT system sleds enables hybrid combinations of compute and storage nodes for increased processing and storage capability. In certain embodiments, a one-third width storage sled may be shared by two one-third width compute sleds in order to enable servicing of cold storage devices such as hard disk drives while allowing compute nodes to remain online. Moreover, an overall compute density of a rack-based IHS may be increased.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a two-dimensional block diagram representation of an example rack-based information handling system (IHS) 100, within which one or more of the described features of the various embodiments of the disclosure can be implemented to support one-third width compute and storage nodes for a modular, scalable/expandable IHS. As a two-dimensional image, certain of the presented components are shown in different orientations relative to each other for simplicity in describing the connectively of the components. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

As presented in FIG. 1, IHS 100 includes a rack assembly 102, which can comprise one or more panels of sheet metal or other material interconnected to form a three dimensional volume generally referred to in the industry as a rack. Unique aspects of the rack assembly 102, which add to the modularity and expandability of IHS 100, are further illustrated and described in one or more of the three-dimensional figures presented herein. As is further presented by these three-dimensional figures, certain components indicated herein are located internal to the rack assembly 102 while other components can be located external to rack assembly 102. These various components are communicatively connected to one or more components via power and communication cables, which are generally represented by the connecting lines of FIG. 1.

IHS 100 comprises a hierarchical arrangement of multiple management modules, along with power and cooling components, and functional processing components or IT components within end nodes 104. In particular, the IHS 100 provides physical and functional support for nodes 104 of one or more fractional widths including one-third width nodes 104a, half-width nodes 104b, full-width nodes 104c, and N-width nodes 104d. "N" is an integer 1, 2 or 3 for a number of nodes 104d in a row of a full-size server rack. "N" may also be used in reference to a fractional portion of a full-size server rack, specifically the ratio 1/N. IT gear 105 contained by the nodes 104, for example computing IT gear 105a, non hot plug (NHP) storage IT gear 105b, hot plug (HP) storage IT gear 105c, and JBOD storage IT gear 105d containing hard disk drives (HDDs) configured as Just A Bunch Of Disks (JBOD). For example, one-third width nodes 104a may provide highly dense compute workloads. Half-width nodes 104b may provide a balance for compute and storage workloads. Full width nodes 104c may be used for dense storage workloads and JBODs.

JBOD (for "just a bunch of disks," or sometimes "just a bunch of drives") is an array of hard disks that have not been configured according to the RAID (redundant array of independent disks) system. The RAID system stores the same data redundantly on multiple disks that nevertheless appear to the operating system as a single disk. JBOD also makes the disks appear to be a single one by combining the drives into one larger logical one. JBOD means the individual disks are presented (to a server) with no amalgamation, pooling or structure applied.

At the rack level, IHS 100 includes a management controller (MC) 106 communicatively connected to infrastructure manager/module (IM) 108. MC 106 can also be referred to as a Rack Management Controller (RMC). MC 106 includes a microcontroller 110 (also generally referred to as a processor) which is coupled via an internal bus 112 to memory 114, I/O interface controller 116, removable storage device (RSD) interface 118 and storage 120. Memory 114 can be flash or other form of memory. Illustrated within memory 114 is rack-level power management and control (RPMC or PMC) firmware 122, which is inclusive of the firmware that controls the operation of MC 106 in communicating with and managing the down-stream components (i.e., processing blocks 124 and end nodes 104, etc.) of IHS 100. IHS 100 may have blocks 124 having a block chassis 125 that provides physical support for one or more widths of nodes 104. For example, a block chassis 125a of block A 124a may receive inserted one-third width nodes 104a. A block chassis 125b of block B 124b may receive inserted half-width nodes 104b. A block chassis 125c of block C 124c may receive inserted full-width nodes 104c. A block chassis 125d of block D 124d may receive N width nodes 104d. Each of the block chasses 125a-d are laterally sized for the full width of the rack assembly 102.

I/O interface controller 116 provides connection points and hardware and firmware components that allow for user interfacing with the MC 106 via one or more connected I/O devices, such as a keyboard, a mouse, and a monitor. I/O interface controller 116 enables a user to enter commands via, for example, a command line interface (CLI), and to view status information of IHS 100. I/O interface controller 116 also enables the setting of operating parameters for IHS 100, among other supported user inputs. RSD interface 118 enables insertion or connection of a RSD 126, such as a storage device (SD) card containing pre-programmable operating firmware for IHS 100. In at least one embodiment, a RSD 126 stores a copy of the operating parameters of IHS 100 and the RSD 126 can be utilized to reboot the IHS 100 to its operating state following a system failure or maintenance shutdown. Storage 120 can be any form of persistent storage and can include different types of data and operating parameters (settings) 127 utilized for functional operation of IHS 100. Among the stored content within storage 120 may also be algorithms 128 for fan and/or power and/or control. For example, the algorithms 128 can facilitate hot servicing or cold servicing of blocks 124, individually labeled as blocks A-D 124a-124d, or nodes 104. In one or more embodiments, IHS 100 can optionally include at least one other MC, illustrated as secondary MC 130, to provide a redundant configuration of MCs 106/130 which are both simultaneously active and functioning. With these embodiments, the redundant configuration enables IHS 100 to continue operating following a failure of either of the MCs 106/130 or in the event one of the MCs 106/130 has to be taken offline for maintenance.

Infrastructure manager (IM) 108 includes cooling subsystem interface 134, Ethernet switch 136, power distribution interface 138 and network interface 140. Network interface 140 enables IHS 100 and specifically the components within IHS 100 to connect to communicate with or via an external network 142.

In addition to the above described MC 106 and IM 108, IHS 100 further comprises a fan and cooling subsystem 143, power subsystem 144, and the plurality of processing blocks A-D 124a-124d. In one implementation, each processing block 124 has an associated block controller (BC) 146. Each block 124 may be enclosed within a block chassis 125 that is inserted to the rack assembly 102 with connectors and conductors aligned for automatic engagement. For example, each block 124 may serve a basic physical building unit with the rack assembly 102, consuming 4 U of vertical space with four horizontal rows of sleds in each block 124 at 1 U per row.

A rack unit, U or RU is a unit of measure that describes the height of equipment designed to mount in a 19-inch rack or a 23-inch rack. The 19-inch (482.6 mm) or 23-inch (584.2 mm) dimension refers to the width of the equipment mounting frame in the rack including the frame; the width of the equipment that can be mounted inside the rack is less. One rack unit is 1.75 inches (44.45 mm) high. A 19-inch rack is a standardized frame or enclosure for mounting multiple equipment modules. Each module has a front panel that is 19 inches (482.6 mm) wide, including edges or ears that protrude on each side which allow the module to be fastened to the rack frame with screws.

Cooling subsystem 143 includes a plurality of fan modules 152, or merely "fans", located in fan receptacles 153 within a respective fan bay module 154 and can be different sizes and provide different numbers of fan modules 152 per fan bay module 154. Also included within cooling subsystem 143 is a plurality of temperature sensors 150, which are further shown distributed within or associated with specific blocks 124. Each fan bay module 154 is located behind (or in the air flow path of) a specific block 124 and the fan modules 152 are communicatively coupled to and controlled by the block controller 146 associated with that block 124. Within each block 124 is at least one, and likely a plurality, of functional/processing nodes 104. A single block controller 146 can be assigned to control multiple blocks 124b-124c, when the number of computing nodes 104 within an individual block does not exceed the pre-established block controller (BC) threshold. Each end node 104 controlled by a respective block controller 146 is communicatively coupled to block controller 146 via one or more cables (not shown). Ethernet switch 136 enables MC 106 to communicate with block controllers 146 via a network of Ethernet cables 156.

Power subsystem 144 generally includes a plurality of power supply units (PSUs) 158, one or more power distribution units (PDUs) 160, and a modular vertical busbar assembly 162. Power subsystem 144 also includes a source of external AC source 164 connected to an internal AC power 166. Each of the individual computing nodes 104 and other components within the IHS 100 that require power are either directly coupled to modular vertical busbar assembly 162 or coupled via power cables to PDUs 160 to obtain power. As one aspect of power distribution within IHS 100, MC 106 can monitor power consumption across the IHS 100 as well as the amount of available power provided by the functional PSUs 158 and trigger changes in power consumption at the block level and ultimately at the (processing) node level based on changes in the amount of available power and other factors. Control of the power subsystem 144 can, in one embodiment, be provided by a separate power controller 168, separate from MC 106. As further illustrated, one additional aspect of the power subsystem 144 for the IHS 100 is the inclusion of AC switch box 170. AC switch box 170 is communicatively coupled to both IM 108 and power subsystem 144. AC switch box 170 includes a plurality of AC inputs 172 and a plurality of AC outlets 174 that are utilized to supply power to the PSUs 158, and other functional components of the IHS 100.

The modular vertical busbar assembly 162 distributes DC power for the rack assembly 102 to each vertical set of four nodes 104 of a respective block 124 via a power interface board (PIB) 176. PIB 176 is a narrow board that provides power and signals to four (4) nodes in a block chassis 124. One PIB 176 provides power to the four (4) full-width nodes 104c of block C 124c, two (2) PIBs 176 provide power to the eight (8) half-width nodes 104b of block B 124b, and three (3) PIBs 176 provide power to the twelve (12) one-third width nodes 104a of block A 124a. Each PIB 176 connects to one 4-node connector in the block controller 146. PIBs 176 may be electrically connected for DC power and ground to the modular vertical busbar assembly 162 by a horizontal busbar 178 of each block chassis 125.

In one or more embodiments, the rack assembly 102 includes a base structure 180 assembled from interconnected panels 182 to form a volumetric space 184 having a front section 186 and a rear section 188. Opposing side walls 190 of the base structure 180 form a front access space 192 and a rear access space 194, respectively, having a width that supports insertion of standard full-width IT gear 105. Guides 196 are located within interior surfaces of the opposing side walls 190 at the front section 186, running from the front section 186 to the rear section 188. The block chasses 125 have a frame that provides a block height, which enables insertion of at least one layer of up to N side-by-side fully functional IT gears 105 within the block chassis 125. The block chassis 125 is physically inserted into the front section 186 of the base structure 180 and held in place by at least two opposing guides 196 of the opposing side walls 190.

In one embodiment, N is an integer from among 1, 2, and 3. When N=2, the modular, expandable rack assembly 102 includes at least one block chassis 125b having one or more rows of two (2) side-by-side fully functional IT gears 105, such as half-width nodes 104a-b, inserted therein. The two side-by-side fully functional IT gears 105 comprise two one-half width IT gear that are one half a size of a standard width IT gear. When N=3, the modular, expandable rack assembly 102 has at least one block chassis 125a having one or more rows of fully functional IT gears 105a-d in three (3) side-by-side one-third width nodes 104a inserted therein. The fully functional IT gears 105a-d within the three side-by-side in one-third width nodes 104a are one third a size of a standard width IT gear.

For purposes of the disclosure all general references to an information handling system shall refer to the rack-level IHS 100, while references to actual computing nodes 104 within the IHS 100 shall be referenced as chassis level computing nodes 104 or IT components. It is further appreciated that within the rack-level IHS 100 can be implemented separate domains or systems that are independent of each other and can be assigned to different independent customers and/or users. However, this level of detail of the actual use of the computing nodes 104 within the general rack-level IHS 100 is not relevant to the descriptions provided herein and are specifically omitted. For clarity, a single rack-level IHS 100 is illustrated. However, an IHS may include multiple racks. For example, one rack may contain only storage sleds with other racks providing computing nodes. In an exemplary embodiment, components of the IHS 100 are organized into a hierarchy as described in TABLE A:

TABLE A

| Level | Device/Module | Acronym | Comments |
| --- | --- | --- | --- |
| Domain Level | Management Controller | MC | In front of Power Bay |
| Domain Level | Infrastructure module | IM | In rear of Power Bay |
| Domain Level | AC Switch Box | ACSB | Behind network switches |
| Domain Level | Power Bay Power Module | PBPM | Connects to 10 supplies and two MCs. Designed by Delta |

TABLE A-continued

| Level | Device/Module | Acronym | Comments |
|---|---|---|---|
| Domain Level | Power Bay | Power Bay | Holds PBPM, MCx2, IM, & ACSB |
| Block Level | Block Controller | BC | Hot Plug Fan Controller + Serial & Node Interface |
| Block Level | Block Controller Distribution Board (BCDB) | BCDB | Fixed in Block |
| Block Level | Power Interface Board | PIB | Columns of 4 nodes |
| Block Level | Temperature Probe Board | TPB | Ambient Temperature Sensor |
| Node Level | Node Power Distribution Board | NPDB | In each node |
| Node Level | 4 drive HDD BP | x4HDDBP | Used in 12 drive FW HP sled |
| Node level | 2 drive HDD PB | x2HDDBP | Used for HP 2.5" in HW sled |

Further, those of ordinary skill in the art will appreciate that the hardware components and basic configuration depicted in the various figures and described herein may vary. For example, the illustrative components within IHS 100 are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

Figure 2:
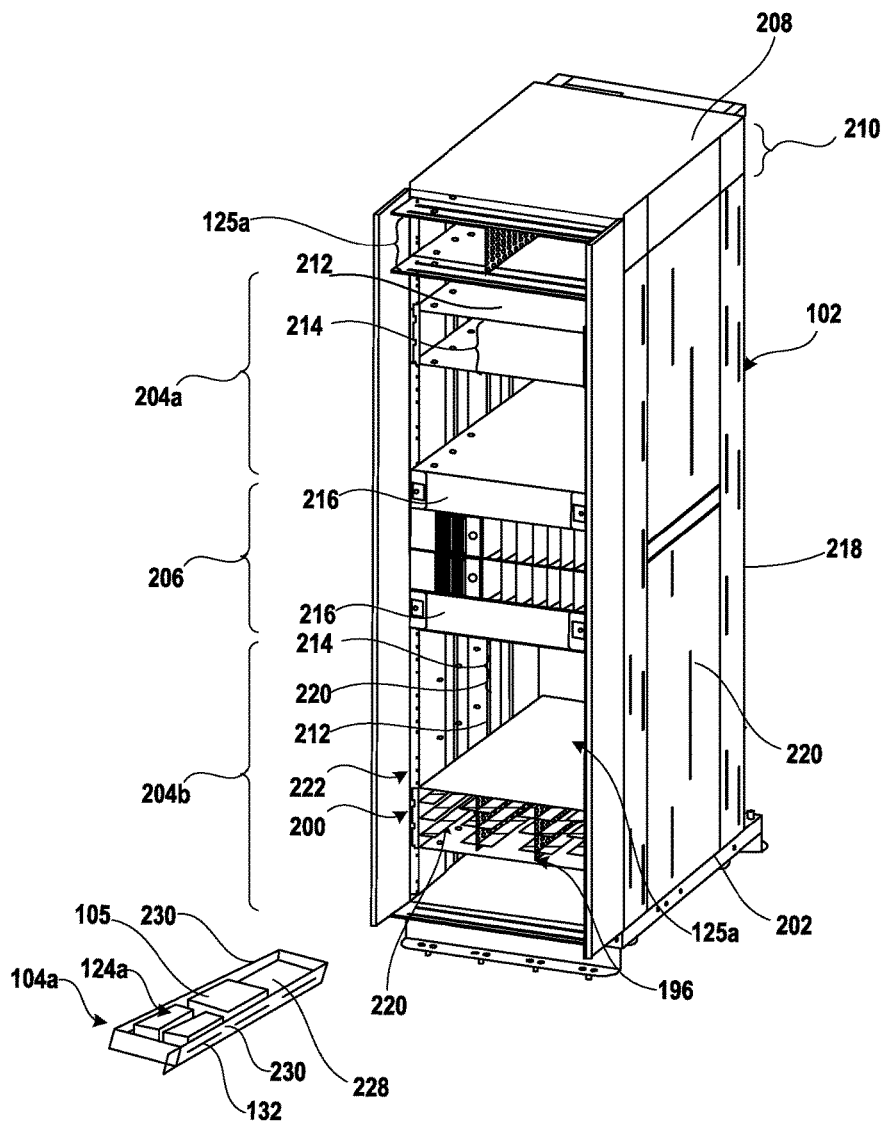
FIG. 2 illustrates a front isometric view of an example rack prior to insertion of functional components for the rack to operate as an IHS, according to one or more embodiments.

FIG. 2 illustrates a front isometric view 200 of an example rack assembly 102 that is ready to receive functional components within a first frame assembly 202 that includes an upper standard zone 204a and a lower standard zone 204b on either side of a power and switch zone 206. The rack assembly 102 may also include a second frame assembly 208 attached on top of the first frame assembly 202 to provide an expansion zone 210 for the rack assembly 102. In an illustrative configuration, the second frame assembly 208 has received a block chassis 125a partitioned to receive one-third width nodes 104a (FIG. 1). The upper standard zone 204a of the first frame assembly 202 may be configured as a 20 GU server zone divided horizontally into four tiers by shelves 212. Each shelf 212 may provide full-width IT bays 214 or include partitions for partial-width bays. The power and switch zone 206 of the rack assembly 102 includes a switch bay 216 (2 U), two power bays 218 (3 GU×2), and another switch bay 216 (2 U). The lower standard zone 204b may be configured as a 25 GU server zone divided into tiers by shelves 212 into full-width IT bays 214.

Opposing sidewalls 220 of the rack assembly 102 are spaced to receive a block chasses 125 (FIG. 1), such as block A chassis 125a. Block A chassis 125a is capable of housing IT components as a block A node 124a that is inserted from an open front side 222 of the rack assembly 102. Block A chassis 125a has one or more rows for insertion of three (3) side-by-side one-third width IT sleds 226 (FIG. 9) that are inserted in at least one of the one or more rows and each contain IT gear 105. In one embodiment, guides 196 (FIG. 1) are provided inside of the block A chassis 125a for supporting insertion of the one-third width IT sleds 226. The guides 196 present a thin lateral thickness of a panel so that the lateral width of a row of three one-third IT sleds 226 substantially defines the width of the block A chassis 125a. The one-third width IT sleds 226 include a base panel 228 that hold the IT gear 105 (e.g., a motherboard with interconnected functional components) between opposing side panels 230. In one embodiment as an alternative to guides 196, horizontal slides 132 on the outer surfaces of the opposing side panels 230 may guide the IT sleds 226 into the block A chassis 125a. For example, interior side surfaces of the block A chassis 125a and three IT sleds 226 in a selected row may be in flush alignment, either as flat vertical surfaces or a nonflat surface with horizontally defined contours that define horizontal slides 132. Right and left interior sides of the block A chassis 125a and right and left side panels 230 of the one-third width IT sleds 226 are corresponding mirror images of one another for sliding frictional alignment. In one embodiment, the one-third width IT sleds 226 each have a width that is less than or equal to one-third of a standard nineteen (19) inch width rack that, in flush lateral alignment, combine to represent a nineteen (19) inch wide interior space of the block chassis 125 (FIG. 1).

Figure 5:
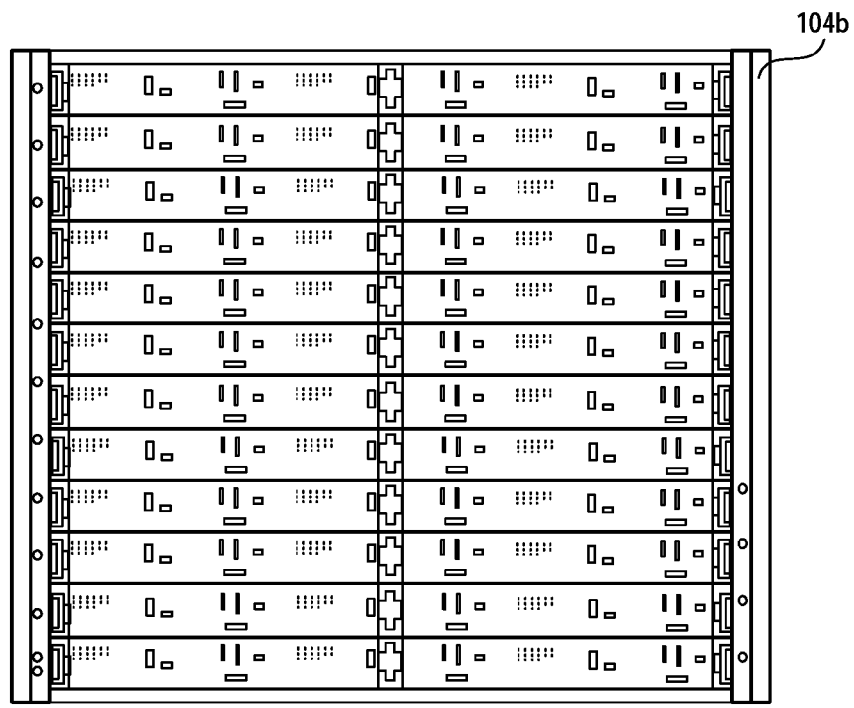
FIG. 5 illustrates a front view of a block having half width IT nodes, according to one embodiment.
Figure 6:
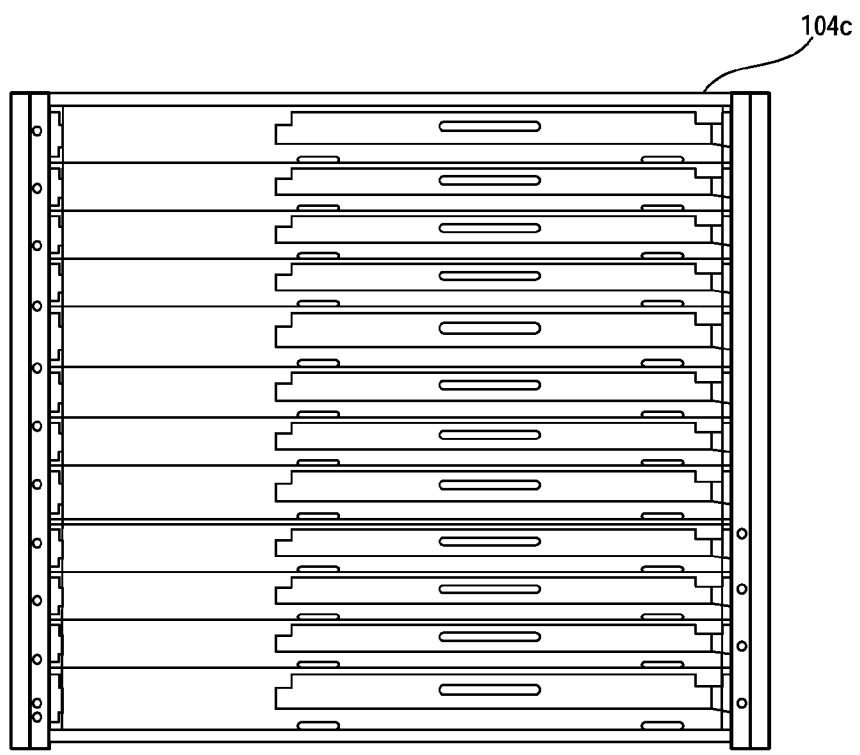
FIG. 6 illustrates a front view of a block having full width IT nodes, according to one embodiment.

FIG. 3 illustrates the example modular, expandable rack assembly 102 having functional components inserted therein to operate as one or more rack-based IHSs 100. Then, the two power bays 218 (FIG. 2) contain power bay chasses 300. FIGS. 3-4 illustrate block 124a having a block chassis 125a that receives one-third width nodes 104a. FIGS. 3 and 5 illustrate block 124b having a block chassis 125b that receives half-width nodes 104b. FIG. 6 illustrates block 124c having a block chassis 125c that receives full-width nodes 104c for the rack assembly 102 (FIG. 3).

Figure 7:
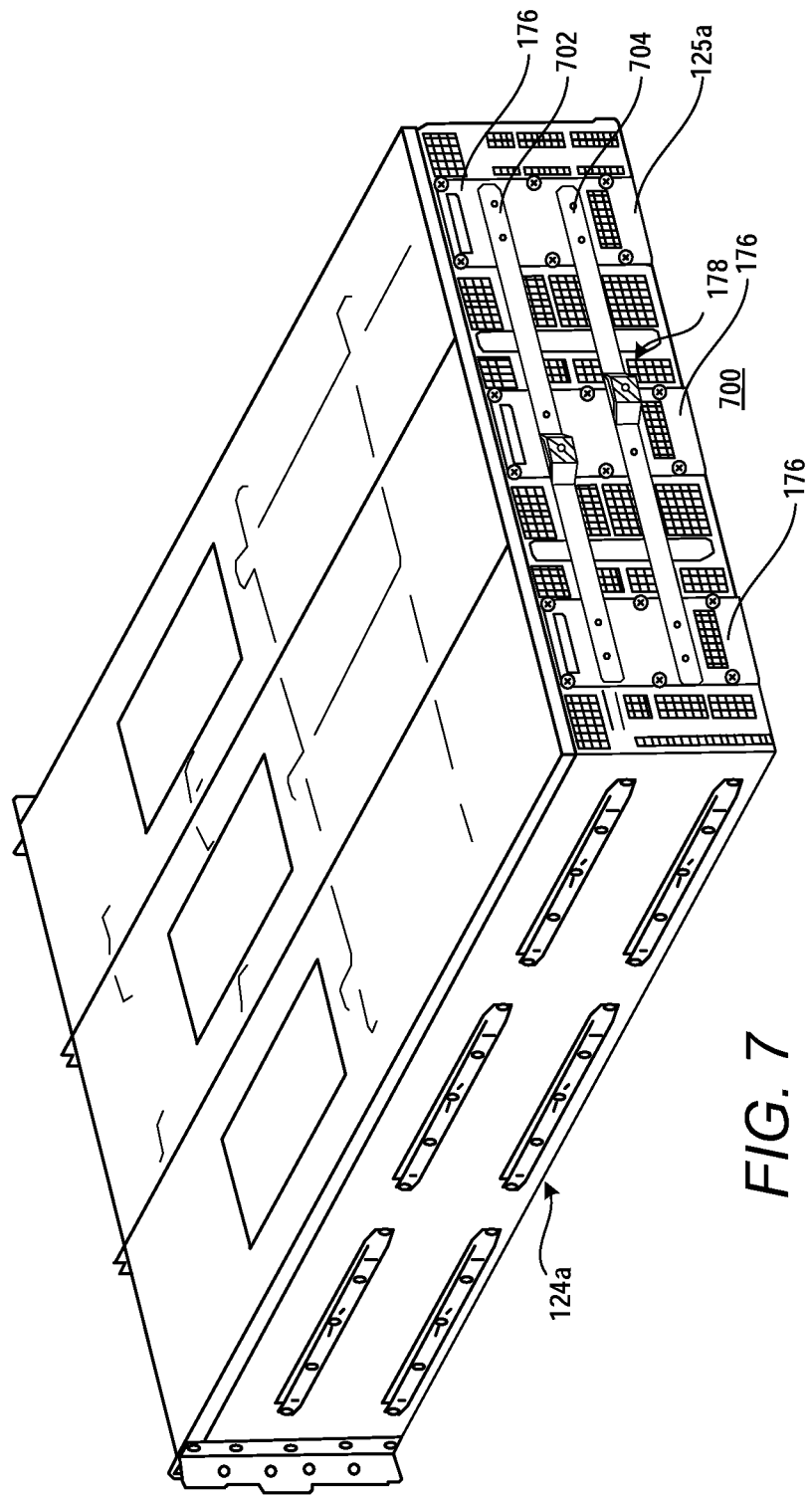
FIG. 7 illustrates a rear isometric view of the block of FIG. 4, according to one embodiment.

FIG. 7 illustrates a rear view 700 of the block 124a having the block chassis 125a with three PIBs 176 that receive power from a horizontal busbar 178 having a power conductor 702 and a ground conductor 704.

Figure 8:
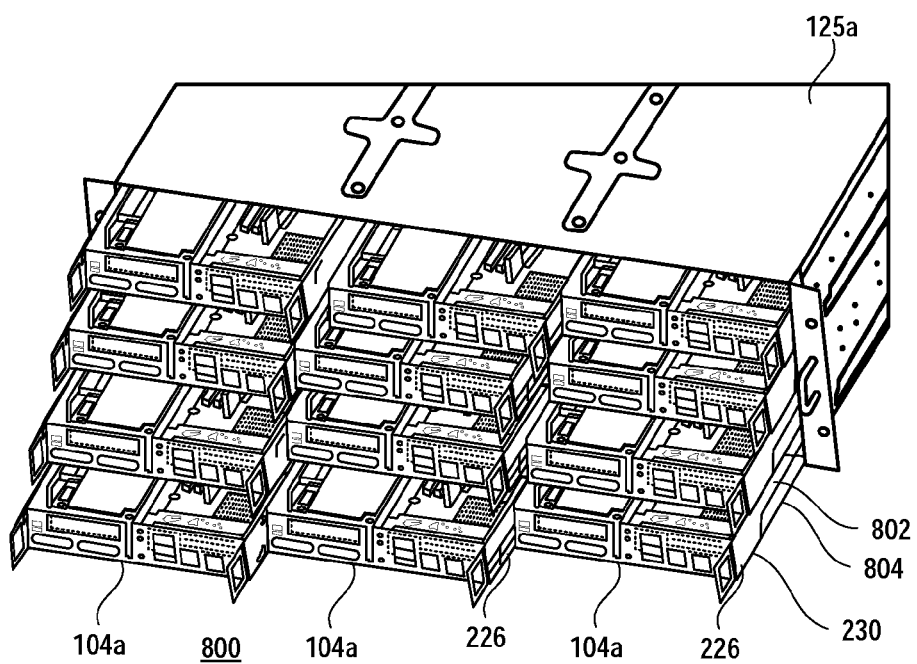
FIG. 8 illustrates a front isometric view of the block of FIG. 4 with one-third width IT nodes partially extended from the block, according to one embodiment.

FIG. 8 illustrates a front view 800 of the block chassis 125a having three one-third width nodes 104a. Rather than including guides 196 (FIG. 1), the three side-by-side fully functional IT gears or IT sleds 226 have side panels 230, which can be configured with exterior physical affordances that enable slideable connection between adjacent IT sleds. For example, in the illustrated embodiment, the side panels 230 of IT sleds 226 can respectively have indentations 802 and protrusions 804 that enable interlocking of a protrusions 804 of a first side of one of the three IT gears or IT sleds 226 into an indentation 802 of the adjacent side of a next IT gear or IT sled 226 to provide flushed side-by-side alignment of each of the three IT gears or IT sleds 226 within the corresponding layer of the block chassis 125a. A relatively flat surfaced side panel 230 may also be utilized to allow for frictional sliding against other side panels.

Figure 9:
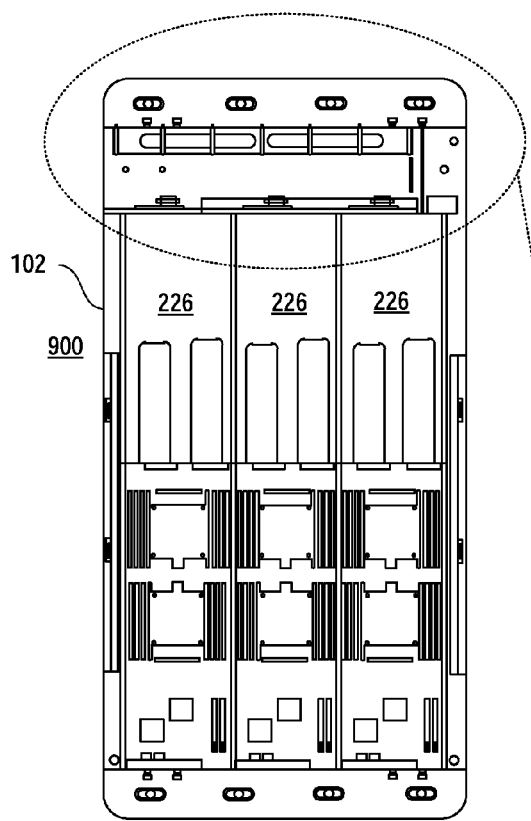
FIG. 9 illustrates a top view in horizontal cross section through a block chassis of the rack assembly of FIG. 3 exposing one-third width nodes, according to one embodiment.
Figure 10:
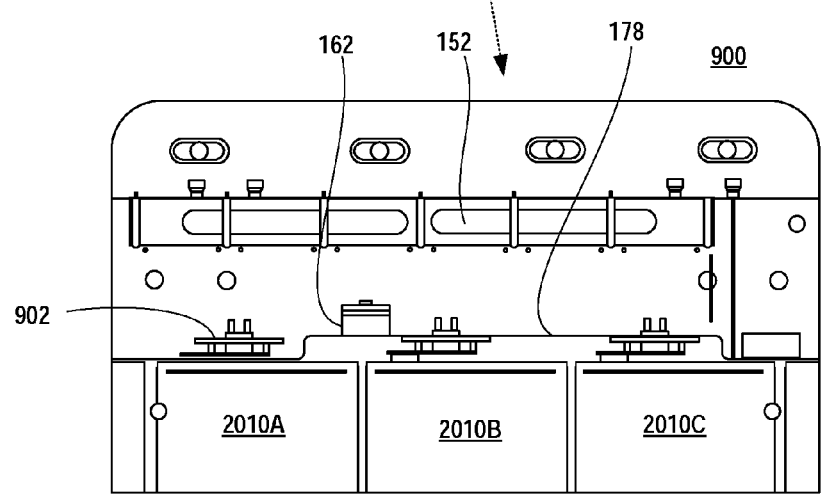
FIG. 10 illustrates a detail view of the rack assembly of FIG. 9, according to one embodiment.

FIGS. 9-10 illustrate a top view 900 in horizontal cross section of the example rack assembly 102 illustrating aft facing power connections 902 of each IT sled 226 extended through a rear side of the block chassis 125 to contact a horizontal busbar 178. The horizontal busbar 178 in turn has been placed into electrical connection with the vertical busbar assembly 162. In one embodiment, the row of three one-third width IT sleds 226 may be a non hot plug storage node placed between and functionally shared by two computing nodes. The computing nodes may be configured to continue operating during cold servicing of the non hot plug storage node when the middle IT sled 226 is withdrawn from an inserted position in the chassis 125, removing power from the storage node.

Figure 11:
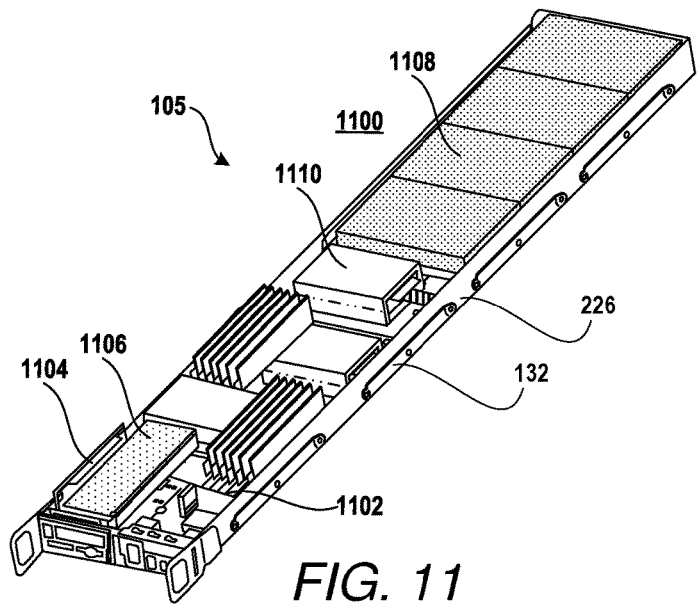
FIG. 11 illustrates an isometric view of an example one-third width node, according to one embodiment.
Figure 12:
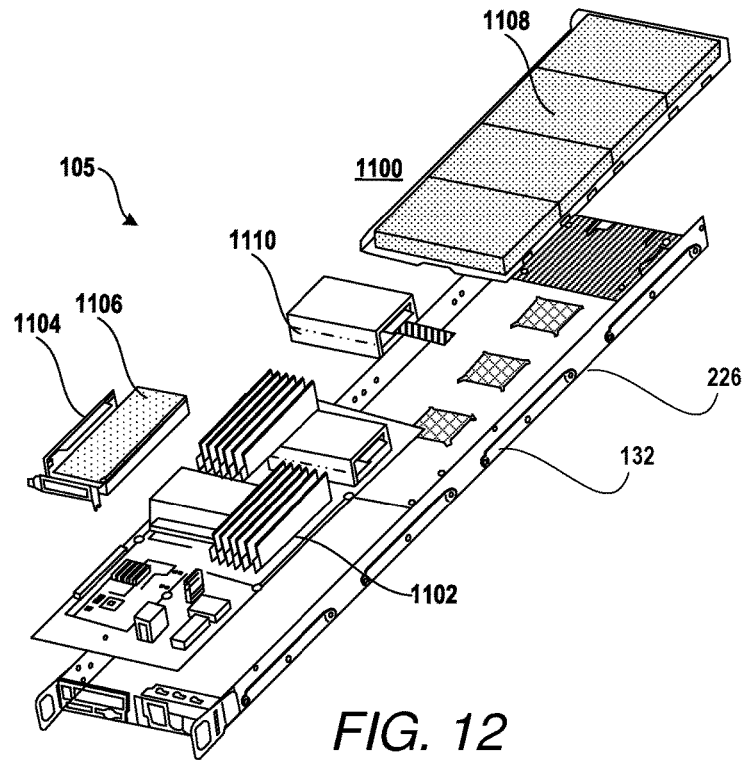
FIG. 12 illustrates an isometric exploded view of the example one-third width node of FIG. 11, according to one embodiment.

FIGS. 11-12 illustrate an isometric view 1100 of a one-third width IT sled 226 that contains IT gear 105 oriented depthways along a motherboard 1102 from front to back. For example, a riser cable 1104 and PCIE (Peripheral Component Interconnect Express) card 1106 are oriented depth wise. With particular reference to FIG. 12, the motherboard 1102 has an elongated depthwise shape. Four 4×3.5 hard disk drive (HDD) modules 1108 and one 2×2.5 HDD module 1110 are arrayed in a single row depthwise rather than in a double row. Depthwise orientation may also be achieved by segregating a computing node to one IT sled 226 and an adjacent storage node to another IT sled 226 for balanced compute and storage workloads rather than using a half width or full width IT sled 226 with both functionalities. More IT components may be placed in a single row thereby rather than in double rows.

Figure 13:
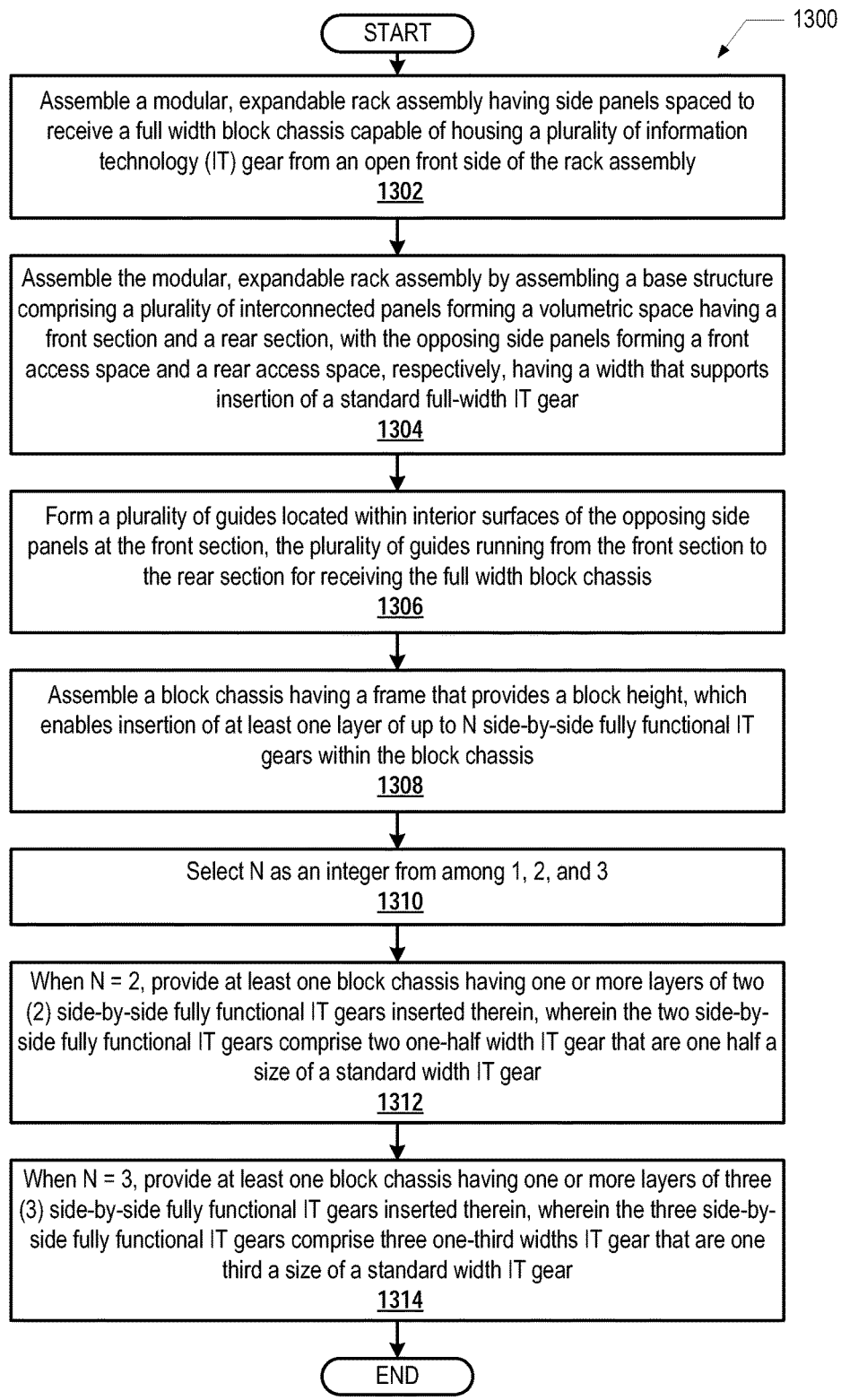
FIG. 13 illustrates a flow diagram of a method for physically supporting components of one or more information handling systems (IHSes), according to one embodiment.

FIG. 13 illustrates a method 1300 for physically supporting components of one or more information handling systems (IHSs). Method 1300 includes assembling a modular, expandable rack assembly having side walls spaced to receive a block chassis capable of housing a plurality of information technology (IT) gear from an open front side of the rack assembly (block 1302). In one embodiment, method 1300 further includes assembling the modular, expandable rack assembly by assembling a base structure comprising a plurality of interconnected panels forming a volumetric space having a front section and a rear section, with the opposing side walls forming a front access space and a rear access space, respectively, having a width that supports insertion of a standard full-width IT gear (block 1304). Method 1300 further comprises forming a plurality of guides located within interior surfaces of the opposing side walls at the front section, the plurality of guides running from the front section to the rear section for receiving the block chassis (block 1306).

In block 1308, method 1300 includes assembling a block chassis having a frame that provides a block height, which enables insertion of at least one layer of up to N side-by-side fully functional IT gears within the block chassis. In one embodiment, the method 1300 includes selecting N as an integer from among 1, 2, and 3 (block 1310). When N=2, method 1300 includes providing at least one block chassis having one or more layers of two (2) side-by-side sleds of fully functional IT gears inserted therein. The two side-by-side sleds of fully functional IT gears comprise two one-half width IT gear that are one half a size of a standard width IT gear (block 1312). In block 1314, when N=3, method 1300 includes providing at least one block chassis having one or more layers of three (3) side-by-side sleds of fully functional IT gears inserted therein. The three side-by-side sleds of fully functional IT gears comprise three one-third width IT gears that are one third a size of a standard width IT gear. Then method 1300 ends.

Figure 14:
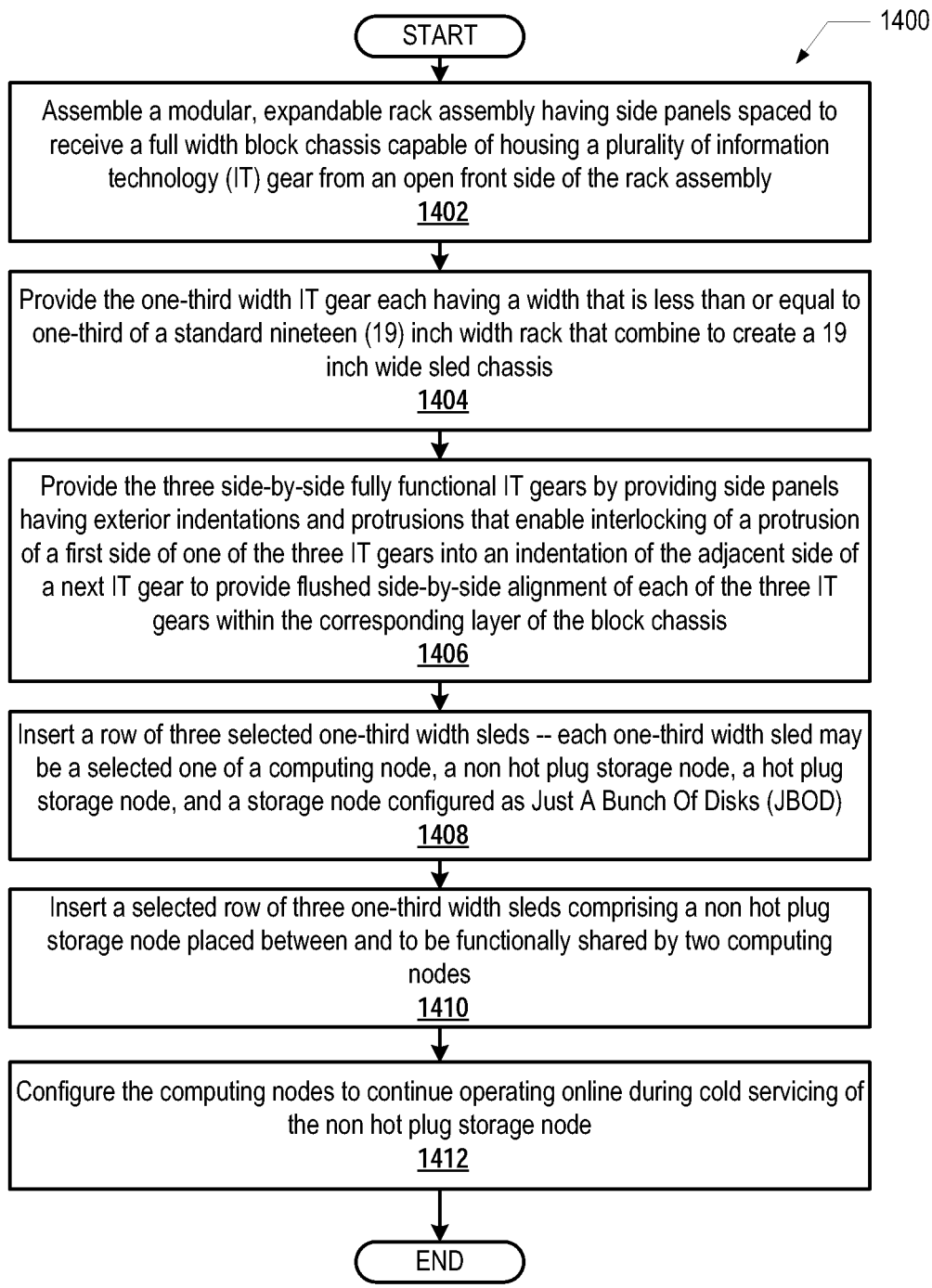
FIG. 14 illustrates a flow diagram of a method for providing one-third width IT gear, according to one embodiment.

FIG. 14 illustrates a method 1400 for providing the one-third width IT gear. In block 1402, method 1400 includes providing the one-third width IT gear each having a width that is less than or equal to one-third of a standard nineteen (19) inch width rack that combine to create a 19 inch wide sled chassis (block 1404). For example, internal guides within the block chassis may have a narrow lateral width, allowing the one-third width IT gear to occupy substantially all of the volume of the block chassis. In another particular embodiment, method 1400 further includes providing the three side-by-side fully functional IT gears by providing side panels having exterior indentations and protrusions that enable interlocking of a protrusion of a first side of one of the three IT gears into an indentation of the adjacent side of a next IT gear to provide flushed side-by-side alignment of each of the three IT gears within the corresponding layer of the block chassis (block 1406). In one embodiment, method 1400 includes inserting a row of three selected one-third width sleds. Each one-third width sled may be a selected one of a computing node, a non hot plug storage node, a hot plug storage node, and a storage node configured as Just A Bunch Of Disks (JBOD) (block 1408). The fractional width provides greater block configuration flexibility in handling workloads that are more computing intensive, more storage intensive, or have a balanced workload. The fractional width also provides greater configuration flexibility in selecting types of storage nodes that may require hot swap servicing.

In one embodiment, method 1400 further includes inserting a selected row of three one-third width sleds comprising a non hot plug storage node placed between and to be functionally shared by two computing nodes (block 1410). The fractional width allows for computing nodes to be placed adjacent to a storage node for functional communication but not in the same IT sled. Withdrawing an IT sled to service the storage node does not require withdrawing the computing node that is separately contained in its own IT sled. Thus, the computing node may continue to operate. In block 1412, method 1400 includes configuring the computing nodes to continue operating online during cold servicing of the non hot plug storage node. Then method 1400 ends.

Figure 15:
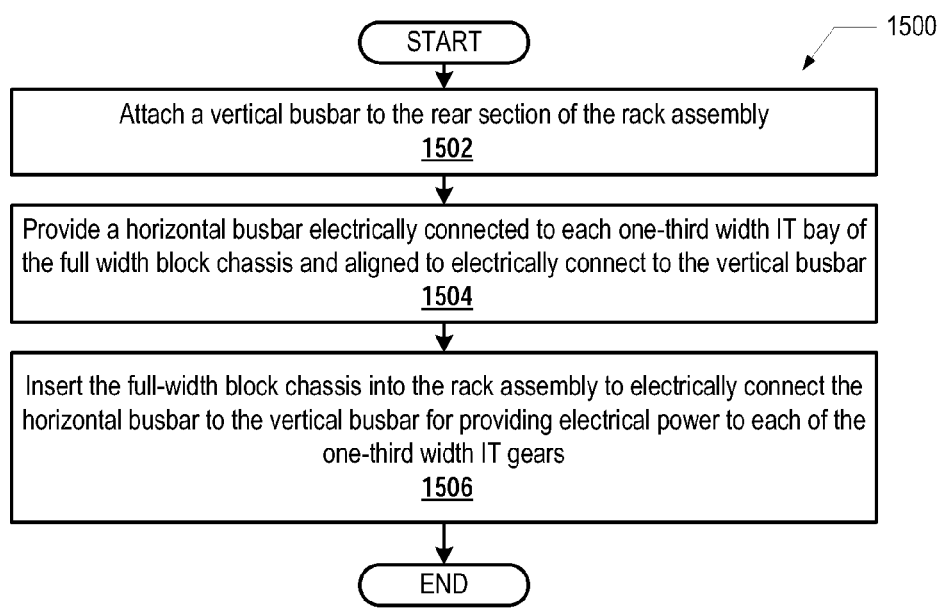
FIG. 15 illustrates a flow diagram of a method for providing electrical power to the one-third width IT gear, according to one embodiment.

FIG. 15 illustrates a method 1500 for providing electrical power to the one-third width IT gear. Method 1500 includes attaching a vertical busbar to the rear section of the rack assembly (block 1502). In block 1504, method 1500 includes providing a horizontal busbar electrically connected to each one-third width IT bay of the block chassis and aligned to electrically connect to the vertical busbar. In block 1506, method 1500 includes inserting the block chassis into the rack assembly to electrically connect the horizontal busbar to the vertical busbar for providing electrical power to each of the one-third width IT gears inserted into the block chassis. Then method 1500 ends.

In the above described flow charts of FIGS. 13-15, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A rack-based information handling system (IHS), comprising: a modular, expandable rack assembly having opposing sidewalls spaced to receive block chasses capable of housing a plurality of information technology (IT) components from an open front side of the rack assembly, the block chasses insertable into the rack assembly and having one or more rows for insertion of IT sleds; three side-by-side one-third width IT sleds, each sled configured with opposing having side panels connected by a base panel and containing IT gear, the three side-by-side one-third width IT sleds inserted in one of the one or more rows ; and a vertical busbar attached to a rear side of the rack assembly, wherein each of the block chasses comprises a horizontal busbar providing an electrical connection at a rear of each one-third width IT bay and aligned to electrically connect to the vertical busbar to provide electrical power to each of the one-third width IT sleds in response to the block chassis being inserted into the rack assembly.

2. The rack-based IHS of claim 1, wherein the block chassis comprises guides defining one-third IT bays for insertion of one-third width IT sleds within the one or more rows of IT sleds.

3. The rack-based IHS of claim 1, wherein the one-third width IT sleds have flat side panels aligned for flush alignment with an adjacent one-third width IT sled for frictional slideable insertion and removal.

4. The rack-based IHS of claim 1, wherein a right side panel of a selected one-third width IT sled has horizontally aligned contour of an indentation and a protrusion that is mirrored by a corresponding left side panel of a left adjacent one-third width IT sled for guided, slideable insertion and removal of one of the selected and adjacent one-third width IT sleds.

5. The rack-based IHS of claim 1, wherein the one-third width IT sleds each have a width that is less than or equal to one-third of a standard nineteen (19) inch width rack that, in lateral flushed alignment and slideable with an adjacent one-third width IT sled, combine to represent a 19-inch wide interior space of the block chassis.

6. The rack-based IHS of claim 1, wherein the three side-by-side one-third width IT sleds contain one or more of computing IT gear, non hot plug storage IT gear, a hot plug storage IT gear, and Just A Bunch Of Disks (JBOD) storage IT gear.

7. The rack-based IHS of claim 1, wherein the one or more one-third width IT sleds contain IT gear oriented depthways along a motherboard from front to back.

8. The rack-based IHS of claim 1, wherein a selected row of three one-third width IT sleds comprises a non hot plug storage node placed between and functionally shared by two computing nodes, wherein the computing nodes are configured to continue operating during cold servicing of the non hot plug storage node.

* * * * *